(12) United States Patent
Oboukhov et al.

(10) Patent No.: US 10,606,699 B2
(45) Date of Patent: Mar. 31, 2020

(54) DATA STORAGE DEVICE EMPLOYING MULTI-LEVEL PARITY SECTORS FOR DATA RECOVERY PROCEDURE

(71) Applicant: Western Digital Technologies, Inc., San Jose, CA (US)

(72) Inventors: Iouri Oboukhov, Rochester, MN (US); Weldon M. Hanson, Rochester, MN (US); Niranjay Ravindran, Rochester, MN (US); David T. Flynn, Mantorville, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/244,426

(22) Filed: Jan. 10, 2019

(65) Prior Publication Data

US 2019/0354434 A1    Nov. 21, 2019

Related U.S. Application Data

(63) Continuation-in-part of application No. 15/983,033, filed on May 17, 2018.

(51) Int. Cl.
*G06F 11/10* (2006.01)
*G11B 5/012* (2006.01)
*H03M 13/11* (2006.01)

(52) U.S. Cl.
CPC .......... *G06F 11/1076* (2013.01); *G11B 5/012* (2013.01); *H03M 13/1105* (2013.01)

(58) Field of Classification Search
CPC ......... H03M 13/1128; H03M 13/1105; H03M 13/1102; H03M 13/255; H03M 13/3927;
(Continued)

(56) References Cited

U.S. PATENT DOCUMENTS 6,047,395 A    4/2000  Zook
7,340,665 B2   3/2008  Tsang
(Continued)

OTHER PUBLICATIONS

X. Liu, L. Zi, D. Yang and Z. Wang, "Improved Decoding Algorithms of LDPC Codes Based on Reliability Metrics of Variable Nodes," in IEEE Access, vol. 7, pp. 35769-35778, 2019. (Year: 2019).*

(Continued)

*Primary Examiner* — Cynthia Britt

(57) ABSTRACT

A data storage device is disclosed wherein a first plurality of codewords are generated each comprising a plurality of symbols, and a first parity sector is generated over the first plurality of codewords. A second plurality of codewords are generated each comprising a plurality of symbols, and a second parity sector is generated over the second plurality of codewords. A third parity sector is generated over a first subset of the first plurality of codewords and a first subset of the second plurality of codewords, and a fourth parity sector is generated over a second subset of the first plurality of codewords and a second subset of the second plurality of codewords. When processing of a first codeword fails, the first codeword and the first parity sector are processed using a LDPC type decoder, and the first codeword and the third parity sector are processed using the LDPC type decoder.

16 Claims, 9 Drawing Sheets

(58) Field of Classification Search
CPC .......... G11B 20/1833; G11B 2020/185; G06F 3/0619; G06F 3/064; G06F 3/0676; G06F 3/0656; G06F 11/1076; G06F 11/1012; G06F 3/0689; G11C 29/52; G11C 2029/0411
See application file for complete search history.

(56) References Cited

U.S. PATENT DOCUMENTS

| | | | | |
|---|---|---|---|---|
| 8,255,763 | B1* | 8/2012 | Yang | H04L 1/0065 |
| | | | | 714/755 |
| 8,375,274 | B1* | 2/2013 | Bonke | H03M 13/1515 |
| | | | | 714/758 |
| 8,448,039 | B2 | 5/2013 | Gunnam | |
| 9,059,737 | B2 | 6/2015 | Coker et al. | |
| 9,201,731 | B2 | 12/2015 | Burd et al. | |
| 9,312,886 | B2 | 4/2016 | Patapoutian et al. | |
| 9,397,698 | B1* | 7/2016 | Burd | H03M 13/1128 |
| 9,412,410 | B1 | 8/2016 | Bentley et al. | |
| 9,632,863 | B2 | 4/2017 | Galbraith et al. | |
| 9,785,504 | B2 | 10/2017 | Wu et al. | |
| 10,263,644 | B1* | 4/2019 | Mazahreh | H03M 13/1108 |
| 10,417,089 | B2* | 9/2019 | Oboukhov | G06F 11/1072 |
| 2011/0085609 | A1* | 4/2011 | Kasher | H04L 1/0057 |
| | | | | 375/260 |
| 2013/0132804 | A1* | 5/2013 | Frayer | G06F 11/1012 |
| | | | | 714/780 |
| 2015/0106675 | A1* | 4/2015 | Li | H03M 13/2942 |
| | | | | 714/755 |
| 2015/0154064 | A1* | 6/2015 | Ghaly | G06F 11/0793 |
| | | | | 714/6.11 |
| 2017/0024274 | A1* | 1/2017 | Yang | G06F 11/1004 |
| 2017/0324430 | A1 | 11/2017 | Han et al. | |
| 2018/0046540 | A1* | 2/2018 | Zhang | H03M 13/1111 |

OTHER PUBLICATIONS

J. Frenzel, S. Muller-Weinfurtner, J. B. Huber and R. R. Muller, "Convergence Behavior of LDPC Decoding and Application to Early Termination," 2018 IEEE 29th Annual International Symposium on Personal, Indoor and Mobile Radio Communications (PIMRC), Bologna, 2018, pp. 1-6. (Year: 2018).*

X. Li and I. Duursma, "Sector-disk codes with three global parities," 2017 IEEE International Symposium on Information Theory ( ISIT), Aachen, 2017, pp. 614-618. (Year: 2017).*

R. Lynch, E Kurtas, A. Kuznetsov, E. Yeo, B. Nikolic "The Search for a Practical Iterative Detector for Magnetic Recording," IEEE Transactions on Magnetics, vol. 40, No. 1, Jan. 2004.

* cited by examiner

US 10,606,699 B2

DATA STORAGE DEVICE EMPLOYING MULTI-LEVEL PARITY SECTORS FOR DATA RECOVERY PROCEDURE

CROSS REFERENCE TO RELATED APPLICATIONS

This application is a continuation-in-part of U.S. patent application Ser. No. 15/983,033, filed on May 17, 2018, which is hereby incorporated by reference in its entirety.

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

FIG. 1 shows a prior art disk format 2 as comprising a number of servo tracks 4 defined by servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo sector $6_i$ further comprises groups of servo bursts 14 (e.g., N and Q servo bursts), which are recorded with a predetermined phase relative to one another and relative to the servo track centerlines. The phase based servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to a head actuator (e.g., a voice coil motor) in order to actuate the head radially over the disk in a direction that reduces the PES.

DETAILED DESCRIPTION

Figure 1:
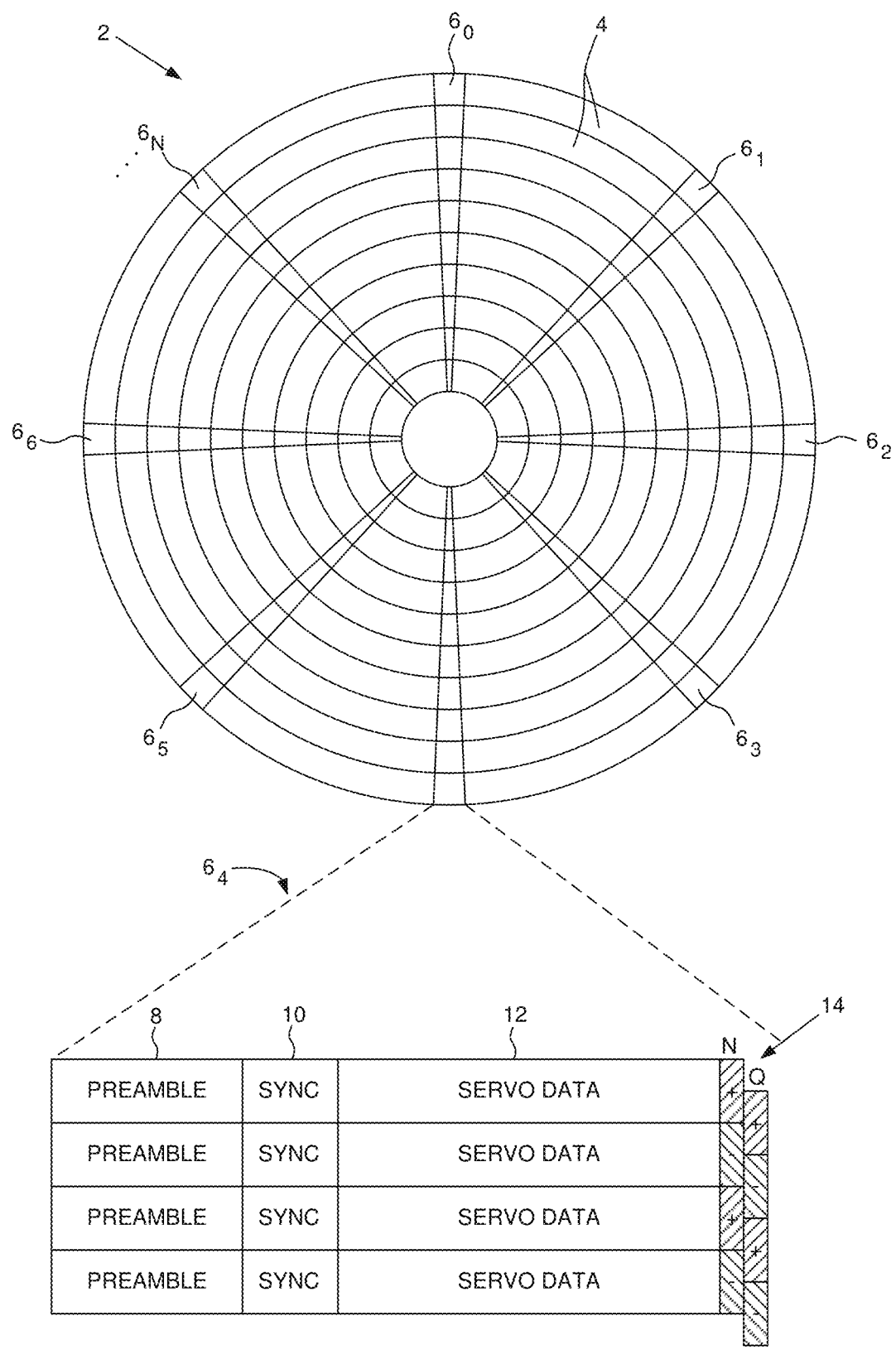
FIG. 1 shows a prior art disk format comprising a plurality of servo tracks defined by servo sectors.
Figure 2A:
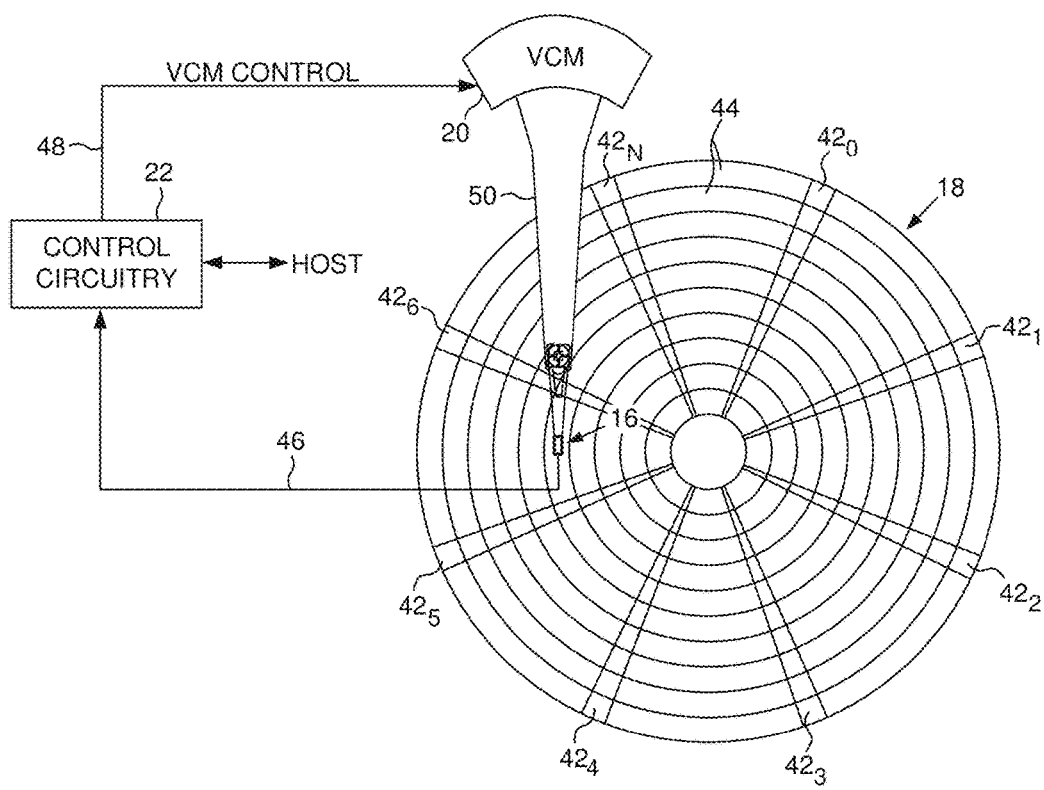
FIG. 2A shows a data storage device in the form of a disk drive according to an embodiment comprising a head actuated over a disk.
Figure 2B:
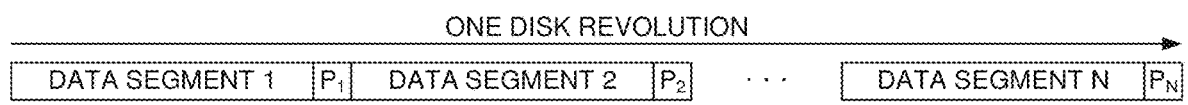
FIG. 2B shows a disk format according to an embodiment wherein a plurality of codewords and a corresponding parity sector are written to a data segment of a data track.
Figure 3A:
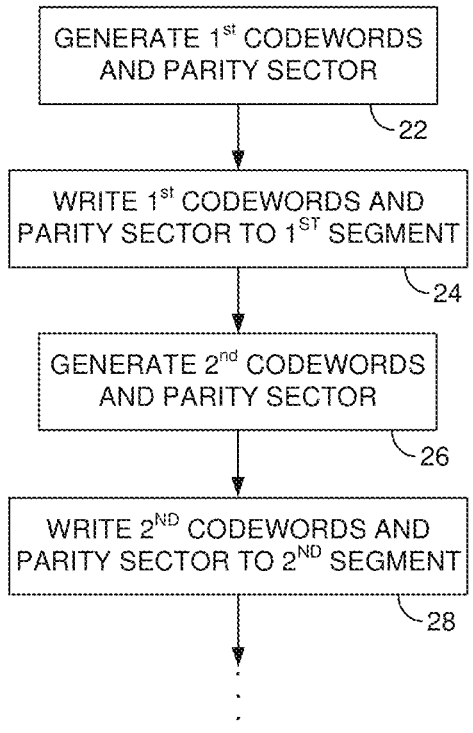
FIG. 3A is a flow diagram according to an embodiment wherein a plurality of codewords and a corresponding parity sector are generated and then written to a data segment of the disk.

FIG. 2A shows a data storage device in the form of a disk drive according to an embodiment comprising a head 16 actuated over a disk 18 comprising a data track (FIG. 2B) having a plurality of data segments including a first data segment and a second data segment. The disk drive further comprises control circuitry 20 configured to execute the flow diagrams of FIGS. 3A and 3B, wherein a first plurality of codewords each comprising a plurality of symbols is generated, and a first parity sector is generated over the first plurality of codewords (block 22). The first plurality of codewords and the first parity sector ($P_i$) are written to the first data segment (block 24). A second plurality of codewords each comprising a plurality of symbols is generated, and a second parity sector is generated over the second plurality of codewords (block 26). The second plurality of codewords and the second parity sector are written to the second data segment. This process is then repeated for any suitable number of data segments, thereby generating a data track formatted such as shown in FIG. 2B.

Figure 3B:
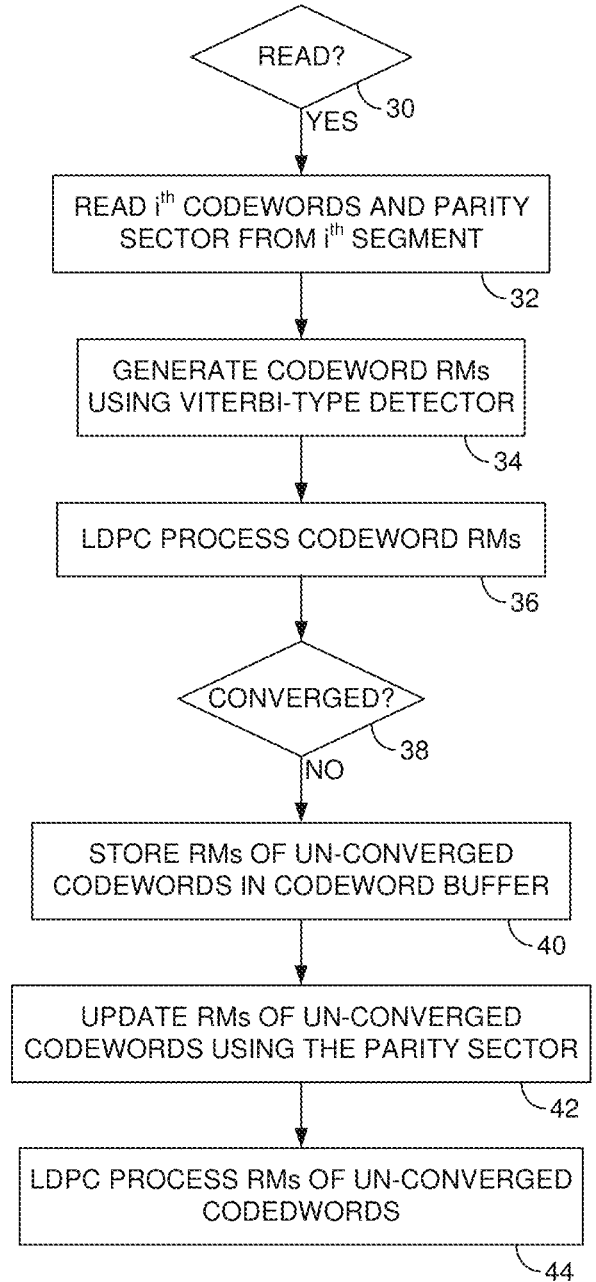
FIG. 3B is a flow diagram according to an embodiment wherein during a read operation the codewords and parity sector are read from each data segment of a data track with each codeword decoded using a low density parity code (LDPC) decoder, wherein un-converged codewords are processed using the parity sector.

Referring to the flow diagram of FIG. 3B when executing a read operation (block 30), during a revolution of the disk the first plurality of codewords and the first parity sector are read from the first data segment (block 32). Each of the first plurality of codewords read from the first data segment are processed using a Viterbi-type detector, thereby generating codeword reliability metrics (block 34). The codeword reliability metrics for each of the first plurality of codewords are iteratively processed using a low density parity check (LDPC) type decoder, thereby generating a LDPC reliability metric for each symbol of each codeword (block 36). The LDPC reliability metrics for each of a plurality of un-converged codewords out of the first plurality of codewords are stored in a codeword buffer (block 40). The LDPC reliability metrics stored in the codeword buffer are processed using the first parity sector, thereby updating the un-converged codeword reliability metrics (block 42). The updated codeword reliability metrics for each of the un-converged codewords are reprocessed using the LDPC-type decoder (block 44).

Figures 4A, 4B:
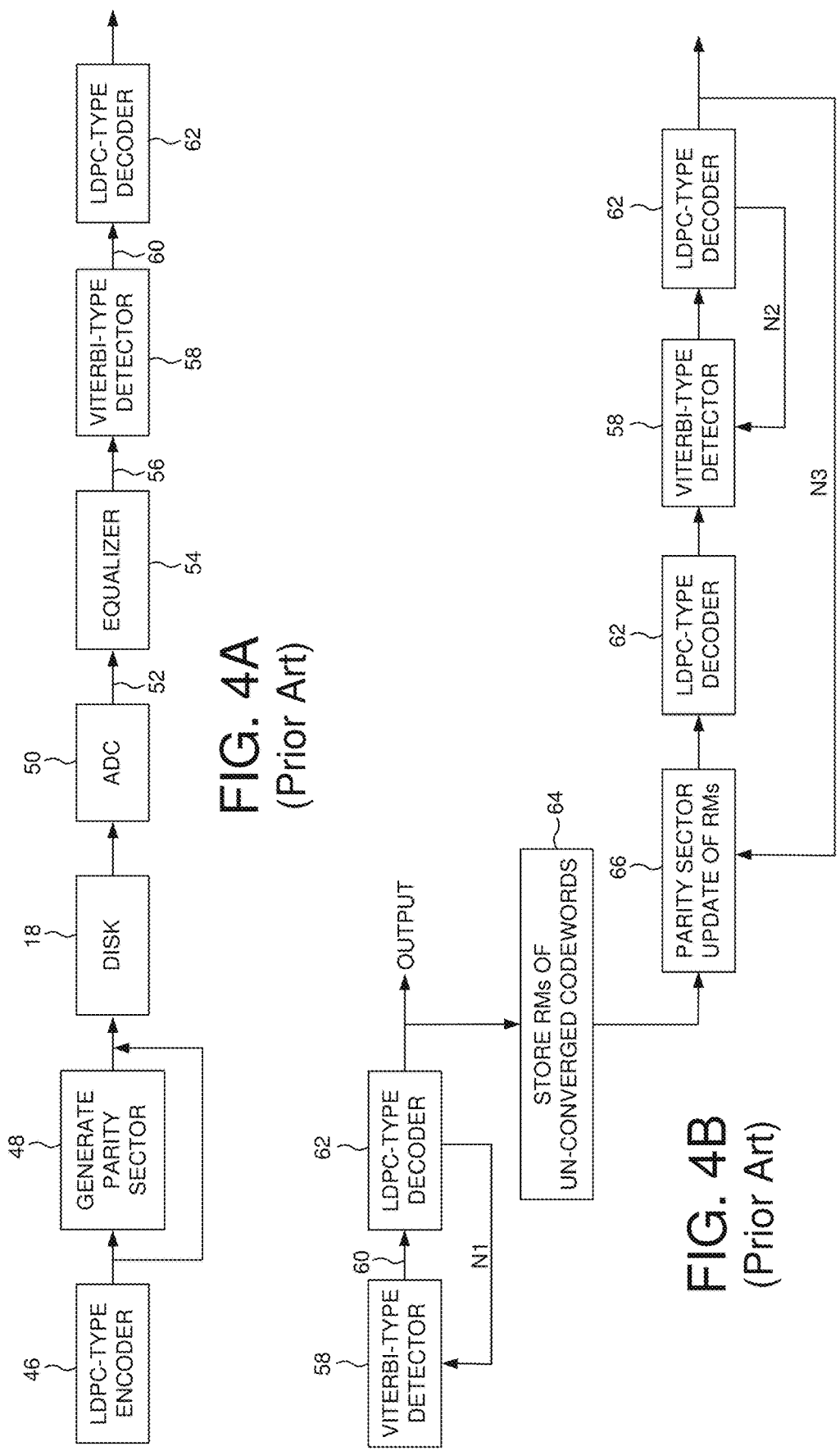
FIG. 4A shows prior art control circuitry according to an embodiment wherein during a read operation a Viterbi-type detector generates reliability metrics for the symbols of each codeword which are processed by a LDPC decoder.
FIG. 4B is a prior art flow diagram wherein when processing an un-converged codeword emphasis is placed on the Viterbi-type detector over the parity sector decoding.

FIG. 4A shows prior art control circuitry wherein an LDPC-type encoder 46 encodes data into a plurality of codewords. A parity sector is generated (block 48), for example, by XORing the corresponding bits of each codeword. The codewords and the parity sector are written to the disk 18. During a read operation, the codewords and the parity sector are read from the disk to generate a read signal, and an analog-to-digital converter (ADC) 50 samples the read signal to generate read signal samples 52. The read signal samples 52 are equalized according to a target partial response (block 54) to generate equalized samples 56. A Viterbi-type detector 58 processes the equalized samples 56 to generate a reliability metric 60 (e.g., log-likelihood ratio (LLR)) for each symbol of a corresponding codeword. The LLRs of each codeword are iteratively processed using an LDPC-type decoder 62.

FIG. 4B shows a prior art flow diagram wherein if the LDPC-type decoding fails due to at least one of the codewords failing to converge, the LLRs for at least one of the un-converged codewords are updated using the Viterbi-type detector 58, and the updated LLRs are processed again by the LDPC-type decoder 62. The process of updating the LLRs of an un-converged codeword using the Viterbi-type detector 58 and reprocessing the updated LLRs by the LDPC-type decoder 62 may be repeated N1 number of times. If after the N1 iterations there is still at least one un-converged codeword, the reliability metrics of the un-converged codeword(s) are stored in a codeword buffer (block 64) and updated using the parity sector 66. The updated reliability metrics are then processed by the LDPC-type decoder 62, and if still not converged, updated again by the Viterbi-type detector 58. The Viterbi-type processing and LDPC processing may be repeated N2 number of times. If after the N2 iterations there is still at least one un-converged codeword, the flow diagram may be repeated (N3 number of times) by again updating the reliability metrics using the parity sector 66. During the N3 iterations, all of the codewords may converge in which case the flow diagram will terminate. If after the N3 iterations there is still at least one un-converged codeword, the control circuitry may execute a heroic data recover procedure (e.g., by rereading the data from the disk) in an attempt to recover the un-converged codeword(s).

The inventors of the present application have identified a drawback with the prior art flow diagram of FIG. 4B in that updating the reliability metrics of an un-converged codeword using the Viterbi-type detector during the N2 iterations may be less effective than updating the reliability metrics using the parity sector. This may be because the Viterbi-type detector 58 updates the reliability metrics in a manner that compensates for signal noise due to inter-symbol interference (ISI) which may actually increase the overall signal noise, whereas updating the reliability metrics using the parity sector 66 compensates for essentially all sources of signal noise. Accordingly, in one embodiment when processing un-converged codeword(s) more emphasis is placed on updating the reliability metrics using the parity sector 66 rather than emphasizing the Viterbi-type update of the reliability metrics as in the prior art flow diagram of FIG. 4B.

Figure 5A:
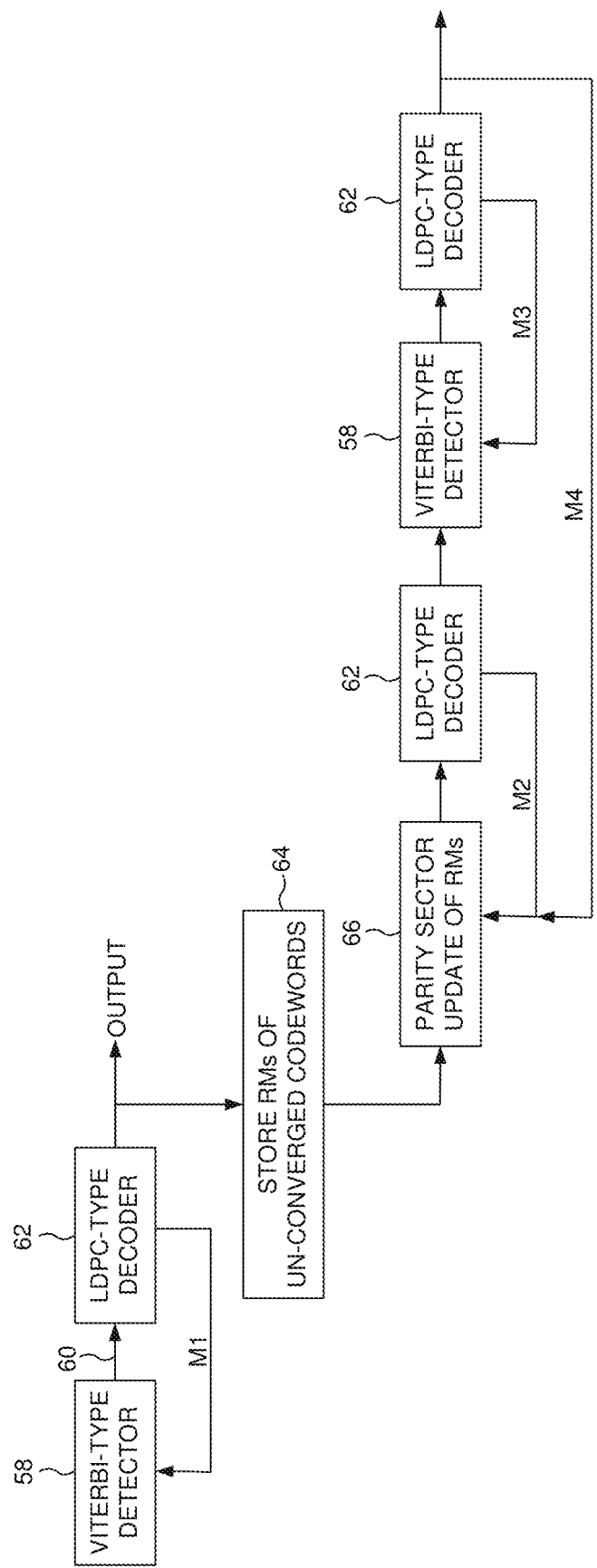
FIG. 5A is a flow diagram according to an embodiment wherein when processing an un-converged codeword emphasis is placed on the parity sector decoding over the Viterbi-type decoding.

FIG. 5A is a flow diagram according to an embodiment wherein when there is at least one un-converged codeword after M1 iterations of the Viterbi-type detector 58 and the LDPC-type decoder 62, the reliability metrics of an un-converged codeword are updated using the parity sector 66, and the updated reliability metrics are processed by the LDPC-type decoder 62. The parity sector update and LDPC decoding is repeated at least one time (M2 iterations) without updating any of the LDPC reliability metrics using the Viterbi-type detector 58. If after the M2 iterations there is still at least one un-converged codeword, the LDPC reliability metrics are processed by the Viterbi-type detector 58 and by the LDPC decoder 62 over M3 iterations. If after the M3 iterations there is still at least one un-converged codeword, the flow diagram is repeated over M4 iterations by again updating the reliability metrics using the parity sector 66. In one embodiment M3 is less than M2, for example, in one embodiment M3 may be one iteration and M2 may be two iterations. In this embodiment, more emphasis is placed on updating the reliability metrics of un-converged codeword(s) using the parity sector 66 as compared to updating the reliability metrics using the Viterbi-type detector 58.

Figure 5B:
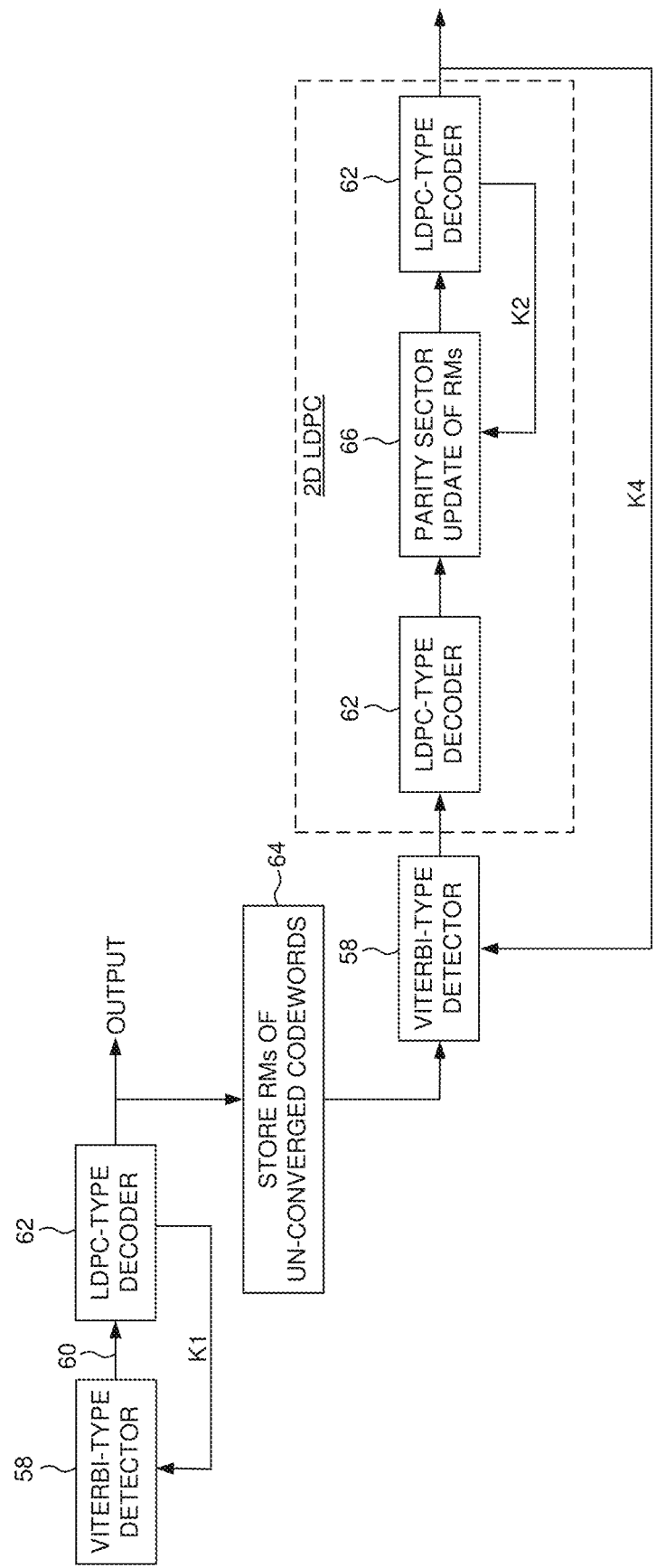
FIG. 5B is a flow diagram according to an alternative embodiment wherein when processing an un-converged codeword emphasis is placed on the parity sector decoding over the Viterbi-type decoding.
Figure 6:
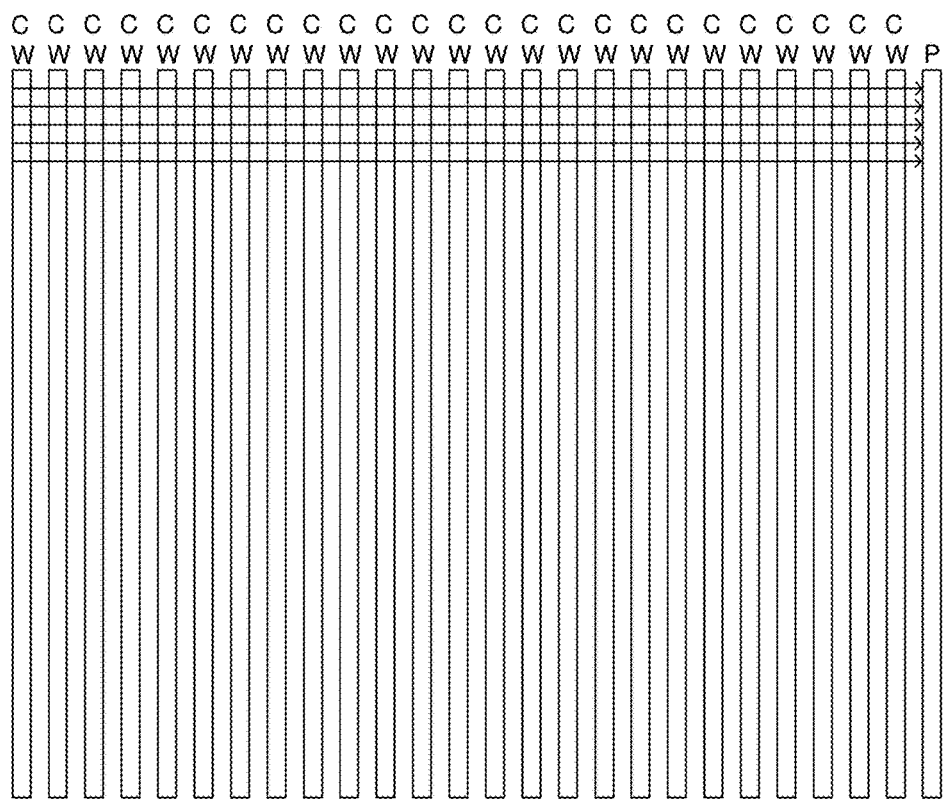
FIG. 6 shows an embodiment wherein the codewords may be processed by the LDPC-type decoder in what is considered a vertical dimension, and the parity sector processed in what is considered a horizontal direction, thereby implementing a 2D LDPC decoding.

FIG. 5B is a flow diagram according to an embodiment wherein when processing the reliability metrics of an un-converged codeword, the reliability metrics are updated using the Viterbi-type detector 58 over K4 outer iterations, and updated using the parity sector 66 and LDPC type decoder 62 over K2 inner iterations, wherein in one embodiment K2 is greater than one thereby emphasizing the parity sector update 66 of the reliability metrics over updating the reliability metrics using the Viterbi-type detector 58. The K2 inner iterations shown in the embodiment of FIG. 5B may be considered a two-dimensional (2D) LDPC type decoding since the parity sector update 66 operates in a first dimension while the LDPC-type decoder 62 operates in a second dimension. An example of this embodiment is shown in FIG. 6 wherein each codeword (CW) may be represented as being LDPC decoded in a vertical dimension whereas the parity sector (P) may be generated over respective symbols of each codeword across a horizontal dimension.

Figure 7:
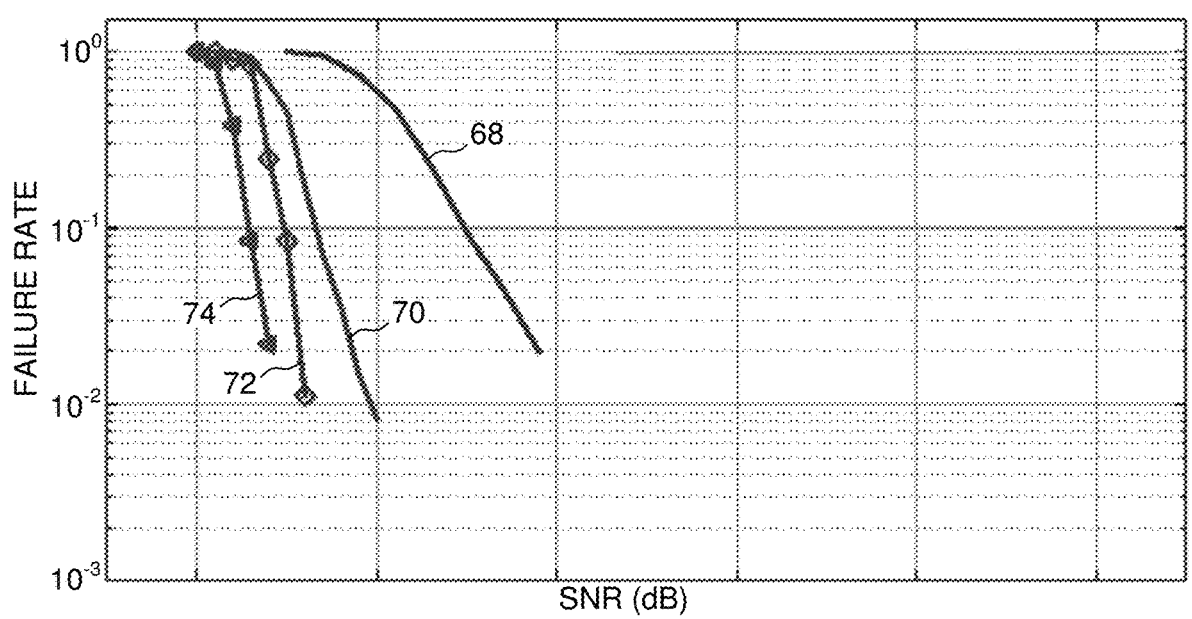
FIG. 7 is a graph showing the performance of the prior art decoding technique of FIG. 4B as compared to different embodiments disclosed herein.

FIG. 7 shows the performance of the prior art decoding technique shown in FIG. 4B without parity sectors (curve 68) and with parity sectors (curve 70) as compared to different embodiments described above. Curve 72 shows the performance improvement when employing sixteen buffers for storing sixteen un-converged codewords using the decoding technique shown in FIG. 5A or 5B. When the number of buffers for storing un-converged codewords is doubled to thirty-two, curve 74 illustrates a further performance improvement when using the decoding technique of FIG. 5A or 5B. Increasing the number of buffers for storing the number of un-converged codewords increases the cost of the control circuitry, and so in one embodiment there is a balancing between the number of buffers employed and the corresponding improvement in performance.

In an embodiment shown in FIG. 2B, a parity sector ($P_j$) may be generated over the codewords stored in each data segment of a data track, wherein the parity sector ($P_j$) is also written to each data segment (at the end of each data segment in this embodiment). When reading the data track, each data segment is processed sequentially, including to recover un-converged codewords using the respective parity sector. This embodiment reduces the size of the codeword buffer needed to store the reliability metrics of un-converged codewords at block 64 since only a segment of the data track is processed at a time. As each data segment is processed sequentially, the codeword buffer is effectively re-used to store the reliability metrics of the un-converged codewords of each data segment.

Figure 8A:
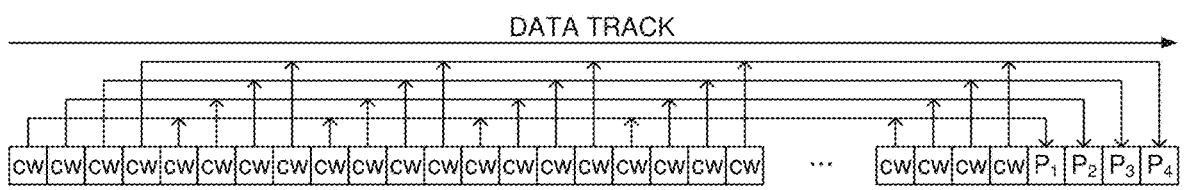
FIGS. 8A and 8B illustrate an embodiment wherein multiple parity sectors are generated over respective blocks of codewords that are interleave written to a data track, wherein the respective codewords are processed over a respective revolution of the disk in order to optimize usage of the codeword buffer that stores un-converged codewords during the parity sector processing.
Figure 8B:
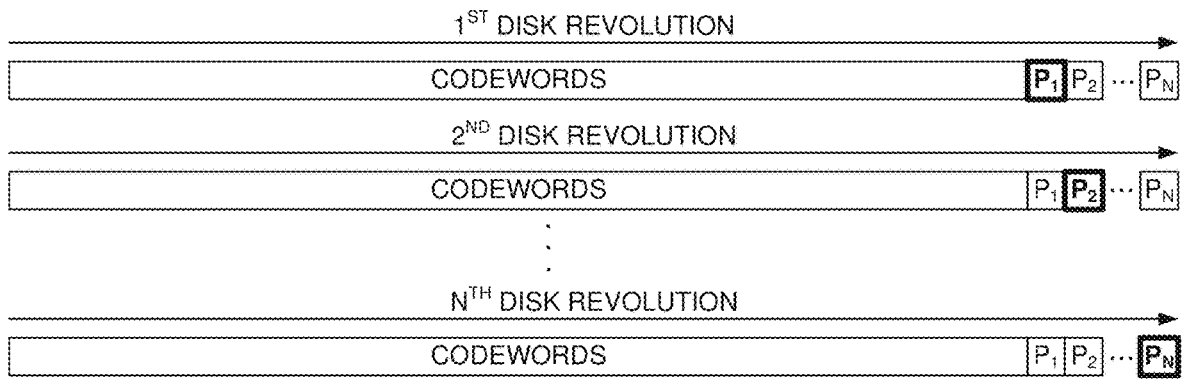

FIGS. 8A and 8B show an embodiment wherein a plurality of parity sectors (e.g., four parity sectors $P_1, P_2, P_3, P_4$) are generated over respective blocks of codewords that are interleave written to a data track (four interleaves in this example) together with the parity sectors. During a normal read operation, the codewords and parity sectors are read from the data track and processed using, for example, the flow diagram shown in FIG. 5A or 5B. That is, when the number of un-converged codewords does not exceed the capacity of the codeword buffer at block 64 used to store the reliability metrics, the iterative decoding procedure may be executed in an attempt to recover the un-converged codewords using the parity sectors. When the number of un-converged codewords in the data track exceeds the capacity of the codeword buffer at block 64, a data recovery procedure is initiated as illustrated in FIG. 8B, wherein during a first revolution of the disk the codewords corresponding to the first parity sector ($P_1$) as well as the first parity sector ($P_1$) are read from the disk and the codewords recovered using the iterative decoding procedure described above. Since only a quarter of the track is processed (the first interleave of codewords), the number of un-converged codewords will typically not exceed the capacity of the codeword buffer at block 64. During a second revolution of the disk, the codewords corresponding to the second parity sector ($P_2$) as well as the second parity sector ($P_2$) are read from the disk and the codewords recovered using the iterative decoding procedure described above. This process is repeated over multiple disk revolutions until all of the codewords of the data track have been recovered using their respective parity sectors.

Figure 9:
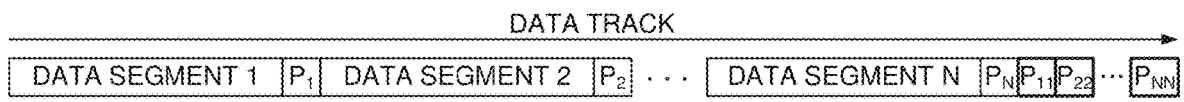
FIG. 9 illustrates an embodiment wherein an inline parity sector is written after each data segment, and a number of interleave parity sectors are written at the end of the data segments wherein each interleave parity sector covers a respective interleave of codewords stored in the multiple data segments.

FIG. 9 shows an embodiment wherein each data track may comprise a number of inline parity sectors ($P_1, P_2, \ldots P_N$) each generated over a respective data segment, as well as a number of interleave parity sectors ($P_{11}, P_{22}, \ldots P_{NN}$) written at the end of the data track each generated over a respective interleave of codewords in the data track such as described above with reference to FIG. 8A. When reading the data track, the inline parity sector ($P_1, P_2, \ldots P_N$) of each data segment may be iteratively processed as described above (e.g., FIG. 5A or 5B) in an attempt to recover the codewords recorded in each data segment. When the number of un-converged codewords for one or more data segments exceeds the capacity of the codeword buffer at block 64, a data recovery procedure may be initiated wherein the interleaved parity sectors ($P_{11}, P_{22}, \ldots P_{NN}$) may be iteratively processed over multiple disk revolutions as described above with reference to FIG. 8B in an attempt to recover one or more of the previously un-converged codewords in the unrecoverable data segment(s). If a sufficient number of codewords in an unrecoverable data segment are recovered using the interleave parity sectors, the data segment may be reprocessed using the inline parity sector since the number of un-converged codewords no longer exceeds the capacity of the codeword buffer at block 64. If a previously unrecoverable data segment is recovered after processing the data track with the interleave parity sectors and then with the inline parity sector, the interleave parity sectors may again be processed in order to recover other un-converged codewords in the remaining unrecoverable data segments. That is, recovering a previously unrecoverable data segment by reprocessing the inline parity sector may improve the chance of recovering other un-converged codewords of other unrecoverable data segments by reprocessing the data track using the interleave parity sectors. The processing of the data segments with the inline parity sectors and the interleave parity sectors may be iterated a number of times over multiple disk revolutions, wherein during each disk revolution the codeword buffer at block 64 may be re-used to store the reliability metrics of the un-converged codewords for the block of codewords being processed, thereby optimizing the use of the codeword buffer.

Figure 10A:
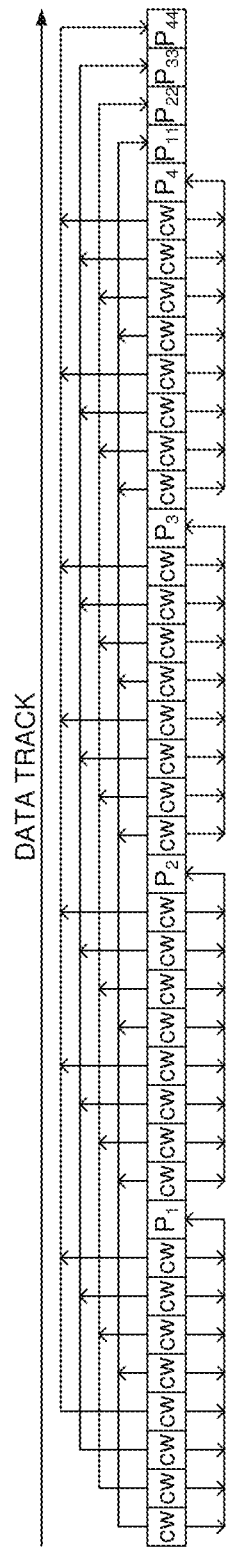
FIG. 10A shows a specific embodiment of FIG. 9 as comprising four data segments with a respective inline parity sector and four interleave parity sectors.

FIG. 10A shows a specific embodiment of the general embodiment shown in FIG. 9, wherein in this example there are four data segments per data track, and eight codewords per data segment. However, other embodiments may employ any suitable number of data segments per data track and any suitable number of codewords per data segment. Further, in some embodiments the number of data segments per data track and/or the number of codewords per data segment may vary across the radius of the disk surface, such as across different zones defined across the disk surface. Also in the specific embodiment of FIG. 10A, four interleave parity sectors ($P_{11}, P_{22}, P_{33}, P_{44}$) are generated per data track; however, other embodiments my employ any suitable number of interleave parity sectors per data track.

Figure 10B:
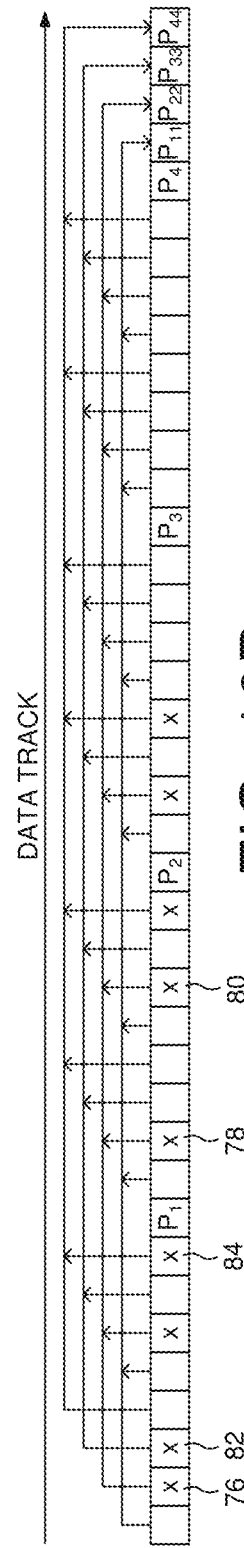
FIG. 10B shows examples of unrecovered codewords in the data segments which may be recovered by processing the inline and interleave parity sectors in any suitable order.

As described above with reference to FIG. 9, when a codeword read from a data segment is unrecoverable using the LDPC type decoder, the inline parity sector for the data segments as well as the interleave parity sectors of the data track may be processed (in any suitable order) during a data recovery procedure in an attempt to recover the codeword. In an embodiment shown in FIG. 10B, the codeword 76 may be unrecoverable during a read operation (as well as the other codewords within the first data segment designated with an "x") after processing each data segment with the respective inline parity sector during a first revolution of the disk. In this embodiment, the data recovery procedure may process the interleave parity sector $P_{22}$ for the interleave that codeword 76 belongs (the second interleave) as described above. If the codeword 76 remains unrecoverable after processing with the interleave parity sector $P_{22}$, in one embodiment the data recovery procedure may process the inline parity sector $P_2$ of the second data segment to recover a codeword 78 from the second data segment (e.g., if processing the interleave parity sector $P_{22}$ recovered codeword 80 in the second data segment). After recovering the codeword 78, the interleave parity sector corresponding to the recovered codeword may be processed in an attempt to recover at least one more codeword from the first data segment. In the example of FIG. 10B, the recovered codeword 78 is in the second interleave and so the interleave parity sector $P_{22}$ may be processed in an attempt to recover at least one more codeword from the first data segment. If an additional codeword is recovered from the first data segment, the data segment may again be processed using the inline parity sector $P_1$ in an attempt to recover the target codeword 76.

In one embodiment, the processing of the interleave parity sector $P_{22}$ in the example of FIG. 10B may recover the target codeword 76 since the target codeword 76 is also in the second interleave. In another embodiment, processing the inline parity sector $P_2$ of the second data segment may recover a codeword in the second data segment that is in an interleave different from the target codeword 76. In this embodiment, the subsequent processing of the corresponding interleave parity sector may recover a codeword in the first data segment that is different from the target codeword 76. However since at least one more codewords have been recovered from the first data segment, the data recovery procedure may reprocess the inline parity sector $P_1$ of the first data segment in an attempt to recover the target codeword 76.

In another embodiment, the data recovery procedure may use a different processing order for the inline and interleave parity sectors in an attempt to recover the codeword 76 from the first data segment. For example, If the codeword 76 remains unrecoverable after processing with the interleave parity sector $P_{22}$, the data recovery procedure may process the interleave parity sector for a different interleave in order to recover at least one more codeword from the first data segment. In the example of FIG. 10B, the inline parity sector $P_{33}$ for the third interleave may be processed to recover codeword 82 of the first data segment. After recovering codeword 82, in one embodiment the inline parity sector $P_1$ of the first data segment may be processed in an attempt to recover the target codeword 76. If the target codeword 76 remains unrecoverable, the data recovery procedure may process yet another of the interleave parity sectors (e.g., interleave parity sector $P_{44}$) to recover at least one more codeword from the first data segment (e.g., codeword 84), and then again reprocess the inline parity sector $P_1$ of the first data segment in an attempt to recover the target codeword 76.

In one embodiment, the processing order of the parity sectors may be predetermined and effectively static such that the processing order may remain the same independent of the number and/or location of unrecoverable codewords within a data segment and/or within an interleave of codewords. In other embodiments described below, the processing order may be configured on-the-fly based on the number of the unrecovered codewords within each data segment and within each interleave.

An example processing order to recover a target codeword from the first data segment (after processing the data segments with the inline parity sectors) may comprise:

$P_{11}, P_1, P_{22}, P_1, P_{33}, P_1, P_{44}$

In another embodiment, the processing order may be configured to process first the interleave parity sector from which the target codeword of the first data segment belongs. So in the above example where the target codeword 76 is in the second interleave, the processing order may comprise:

$P_{22}, P_1, P_{11}, P_1, P_{33}, P_1, P_{44}$

In one embodiment, this processing order may recover the target codeword 76 sooner since processing the interleave parity sector $P_{22}$ may recover the codeword 76 without any further processing.

Clearly there may be a large number of possible processing orders for the inline and interleave parity sectors. In one embodiment, the processing order may be preconfigured based on a predetermined nominal processing order by evaluating a subset of production disk drives, and then the processing order may be adapted over time as each disk drive is used in-the-field. For example, the data recover procedure may attempt to recover a codeword by adapting the processing order over time based on the recovery time needed to recover one or more codewords.

In another embodiment, the processing order of the inline and interleave parity sectors of a data track may be configured based on the number of unrecoverable codewords within each data segment and/or within each interleave. For example, in one embodiment the processing order of the interleave parity sectors may be based on the number of unrecovered codewords within each interleave. In the example of FIG. 10B, each interleave corresponding to each interleave parity sector has the following number of unrecoverable codewords:

$P_{11}=0; P_{22}=5; P_{33}=1; P_{44}=3$

Processing the first interleave corresponding to interleave parity sector $P_{11}$ would be of no benefit since there are no unrecovered codewords in the first interleave. Out of the rest of the interleaves, the third interleave has a single unrecovered codeword, the fourth interleave three unrecovered codewords, and the second interleave five unrecovered codewords. Accordingly, in one embodiment it may be more likely to recover at least one codeword from the interleave that has the fewest unrecovered codewords, and so the processing order of the parity sectors in the example of FIG. 10B may comprise:

$P_{33}, P_1 \ldots$

In one embodiment, after each step in the processing sequence (i.e., after processing an inline or interleave parity sector), the number of unrecovered codewords within each interleave may again be evaluated to select the next parity sector to process.

In another embodiment, an inline parity sector of a data segment may be selected for processing based on the number of unrecovered codewords within each data segment. In the example of FIG. 10B, after processing the data segments with the inline/interleave parity sectors, at a certain point in the processing sequence the second data segment may have three unrecovered codewords and the third data segment may have two unrecovered codeword. Accordingly the data recovery procedure may process the inline parity sector $P_3$ of the third data segment over processing the inline parity sector $P_2$ of the second data segment. Similar to the above described embodiment, after each step in the processing order (i.e., after processing an inline or interleave parity sector), the number of unrecovered codewords within each data segment may again be evaluated to select the next parity sector to process. In yet another embodiment, the number of unrecovered codewords in both the data segments and the interleaves may be evaluated to determine the next parity sector to process (e.g., inline or interleave parity sector).

In one embodiment, the number of unrecovered codewords that may be stored in the codeword buffer 64 (FIG. 5A) during a revolution of the disk may be limited due to the size of the codeword buffer 64. In this embodiment, the data recover procedure may use a separate revolution of the disk to process each interleave parity sector, and therefore in one embodiment the inline parity sectors of each data segment may be reprocessed during each revolution of the disk. For example, the above processing order:

$P_{22}, P_1, P_{11}, P_1, P_{33}, P_1, P_{44}$ may be modified in this embodiment to comprise:

Revolution 1: $P_{22}$
Revolution 2: $P_1, P_2, P_3, P_4, P_{11}$
Revolution 3: $P_1, P_2, P_3, P_4, P_{33}$
Revolution 4: $P_1, P_2, P_3, P_4, P_{44}$ In an embodiment wherein the codeword buffer 64 can store the unrecovered codewords from at least two of the interleaves, the processing order may be modified to take advantage of the sequential processing of the corresponding inline/interleave parity sectors without needing additional revolutions to regenerate the interleave parity sectors. For example, if the codeword buffer 64 can store all of the unrecovered codewords for a data track, then the data recovery procedure may process the inline and interleave parity sectors in any suitable order after a single revolution of the disk without needing to regenerate any of the interleave parity sectors over additional revolutions of the disk.

In one embodiment, an additional parity equation may be generated when processing the parity sectors during the data recovery procedure. Referring again to the example shown in FIG. 10A, by noting that:

$P_1 \oplus P_2 \oplus P_3 \oplus P_4 = $ XOR ($\oplus$) of all codewords in the data track; and $P_{11} \oplus P_{22} \oplus P_{33} \oplus P_{44} = $ XOR of all codewords in the data track; then $$P_1 \oplus P_2 \oplus P_3 \oplus P_4 \oplus P_{11} \oplus P_{22} \oplus P_{33} \oplus P_{44} = 0$$

Therefore the above equation becomes an additional parity equation that may be processed using the LDPC type decoder. That is, in one embodiment the codewords representing the inline and interleave parity sectors may be processed by the LDPC type decoder in an attempt to recover one or more of the parity sectors as part of the data recovery procedure. In this embodiment, the codewords (CW) shown in FIG. 6 are the parity sectors and the parity sector (P) in FIG. 6 contains all zeros. The additional parity equation may be processed at any suitable time during the data recover procedure; that is, it may be inserted into the processing order at any suitable time based on any suitable criteria such as the criteria described above.

In the embodiments described above, the processing order of the parity sectors is configured by the data recovery procedure based on recovering a single data sector from a data segment. In other embodiments, the processing order of the parity sectors may be configured based on the data recovery procedure attempting to recover multiple data sectors from a data segment, or based on recovering an entire data segment, multiple data segments, or an entire data track. That is, in some embodiments the processing order of the parity sectors may be configured based on the number of data sectors to be recovered, their location within each data segment, and/or the location within each interleave. Also in the embodiments described above, a single inline parity sector is generated per data segment and a single interleave parity sector is generated per interleave. However in other embodiments, more than one inline parity sector may be generated per data segment, and/or one or more interleave parity sector may be generated per interleave as described below.

Any suitable technique may be employed to update the LLRs of a codeword using the parity sector. In one embodiment when processing the LLRs of the codewords corresponding to one of the parity sector parity bits, at least one of the LLRs across the un-converged codewords is modified so that the likelihood of a codeword bit flips its binary state, thereby satisfying the parity of the parity sector. When at least one of the LLRs is updated correctly, it improves the likelihood the corresponding codeword will converge during the subsequent processing by the LDPC-type decoder 62. As each un-converged codeword converges, there is a corresponding improvement in the update accuracy of the parity sector, further improving the likelihood of recovering all of the un-converged codewords. A suitable technique for updating the LLRs of un-converged codewords using a parity sector is disclosed in U.S. Pat. No. 9,632,863 entitled "TRACK ERROR-CORRECTION CODE EXTENSION," the disclosure of which is incorporated herein by reference.

In the embodiments described above, a block of codewords may be covered by a parity sector (or an interleave parity sector as shown in FIG. 8A). In other embodiments, a block of codewords may be covered by multiple parity sectors over different interleaves of the codewords, for example, by generating a first parity sector over each symbol in a first interleave (e.g., even interleave) of a codeword, and generating a second parity sector over each symbol in a second interleave (e.g., odd interleave) in the codeword. In one embodiment, multiple parity sectors may be generated over different symbol resolutions (e.g., every ½ and every ¼ symbols), and the reliability metrics updated in a cascading manner starting with the lowest resolution parity sector. Examples of this embodiment are disclosed in U.S. patent application Ser. No. 15/161,165 entitled "DATA STORAGE DEVICE DYNAMICALLY GENERATING EXTENDED REDUNDANCY OVER INTERLEAVES OF A DATA TRACK," the disclosure of which is incorporated herein by reference.

Any suitable LDPC-type encoder/decoder may be employed in the embodiments described above. In general, an LDPC-type decoder uses any suitable form of iterative belief propagation techniques. In addition, the LDPC-type decoder may perform any suitable number of iterations before declaring a codeword converged or un-converged, wherein the number of iterations may be considered an ECC system parameter that may be calibrated to achieve optimal performance in terms of accuracy and speed.

In the embodiments described above, the data track format such as shown in FIGS. 2B and 8A may be considered a physical track format in that the codewords may be sequentially written to each physical data sector of a physical data track. In another embodiment, the data track formats described above may be considered logical track formats with the codewords written to each physical data track in an interleaved (distributed) manner. That is, instead of writing each codeword to a respective physical data sector on the disk, the codewords may be divided into segments (e.g., four segments) wherein each segment may be interleave written to multiple of the physical data sectors (e.g., interleave writing a segment from each of four codewords to a single physical data sector). This technique of interleave writing the codewords to the physical data sectors of a physical data track may help recover from an anomaly such as a track squeeze or long defect corrupting one of the physical data sectors.

Also in the embodiments described above, each data track such as shown in FIGS. 2B and 8A may be formatted as a concentric data track or as a spiral data track. In general, a data track comprises at least two data segments and respective parity sectors that are accessible within a single revolution of the disk. In the embodiment of FIG. 2B, each data segment and corresponding inline parity sector are processed sequentially over a revolution of the disk, thereby optimizing the use of the codeword buffer at block 64. In the embodiment of FIG. 8B, the codewords of each interleave and corresponding interleave parity sector are processed over a respective revolution of the disk, thereby optimizing the use of the codeword buffer at block 64.

In the embodiments described above, the data storage device may include one or more types of non-volatile memory configured to store codewords in data segments. Examples of suitable non-volatile memory include rotating magnetic media (e.g., a hard disk drive), magnetic tape media (e.g., tape drive), and solid state memory (e.g., a solid state drive) which may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., Single-Level Cell (SLC) memory, Multi-Level Cell (MLC) memory, TLC, QLC, etc., or any combination thereof), NOR memory, EEPROM, Ferroelectric Memory (FeRAM), Magneto-resistive RAM (MRAM), other discrete NVM chips, or any combination thereof. The various data protection and correction schemes described herein may be applied to data stored in such non-volatile memory. As an example, the data tracks shown in the various figures in this disclosure may instead be non-volatile memory storage elements such as pages, and the disk revolutions depicted in those figures may instead be memory reading passes/attempts.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the NVSM and read into a volatile semiconductor memory when the data storage device is powered on. In yet another embodiment, the control circuitry comprises suitable logic circuitry, such as state machine circuitry.

In various embodiments described above, a disk drive may include a magnetic disk drive, a solid state disk drive, an optical disk drive, a hybrid drive, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
   a disk comprising a data track having a plurality of data segments including a first data segment and a second data segment;
   a head actuated over the disk; and
   control circuitry configured to:
      generate a first plurality of codewords each comprising a plurality of symbols;
      generate a first parity sector over the first plurality of codewords;
      write the first plurality of codewords and the first parity sector to the first data segment;
      generate a second plurality of codewords each comprising a plurality of symbols;
      generate a second parity sector over the second plurality of codewords;
      write the second plurality of codewords and the second parity sector to the second data segment;
      generate a third parity sector over a first subset of the first plurality of codewords and a first subset of the second plurality of codewords;
      generate a fourth parity sector over a second subset of the first plurality of codewords and a second subset of the second plurality of codewords;
      read a first codeword from the first data segment and first process the first codeword using a low density parity check (LDPC) type decoder; and
      when the first processing of the first codeword fails:
         process the first codeword and the first parity sector using the LDPC type decoder; and
         process the first codeword and the third parity sector using the LDPC type decoder.

2. The data storage device as recited in claim 1, wherein:
   the first subset of the first plurality of codewords consists of a first interleave of the first plurality of codewords; and
   the second subset of the first plurality of codewords consists of a second interleave of the first plurality of codewords.

3. The data storage device as recited in claim 1, wherein prior to the processing of the first codeword and the third parity sector, the control circuitry is further configured to process the second parity sector using the LDPC type decoder to recover a second codeword read from the second data segment.

4. The data storage device as recited in claim 1, wherein when the first processing of the first codeword fails, the control circuitry is further configured to:
   process the fourth parity sector using the LDPC type decoder to recover a second codeword read from the first data segment; and when the second codeword is recovered, process the first codeword and the first parity sector using the LDPC type decoder.

5. The data storage device as recited in claim 4, wherein the control circuitry is further configured to:
generate a third plurality of codewords each comprising a plurality of symbols;
generate a fifth parity sector over the third plurality of codewords;
write the third plurality of codewords and the fifth parity sector to a third data segment of the data track;
generate a sixth parity sector over a third subset of the first plurality of codewords, a third subset of the second plurality of codewords, and a third subset of the third plurality of codewords; and
when the first processing of the first codeword fails:
process the sixth parity sector using the LDPC type decoder to recover the second codeword read from the first data segment; and
when the second codeword is recovered, process the first codeword and the first parity sector using the LDPC type decoder.

6. The data storage device as recited in claim 5, wherein when the first processing of the first codeword fails, the control circuitry is further configured to order the processing of the fourth parity sector and the sixth parity sector based on a number of unrecovered codewords covered by each of the fourth parity sector and the sixth parity sector.

7. The data storage device as recited in claim 6, wherein when the first processing of the first codeword fails, the control circuitry is further configured to process the fourth parity sector before processing the sixth parity sector when the number of unrecovered codewords covered by the fourth parity sector is less than the number of unrecovered codewords covered by the sixth parity sector.

8. The data storage device as recited in claim 5, wherein prior to the processing of the first codeword and the third parity sector, the control circuitry is further configured to process at least one of the second parity sector or the fifth parity sector using the LDPC type decoder to recover a second codeword read from one of the second data segment or the third data segment.

9. The data storage device as recited in claim 8, wherein the control circuitry is further configured to order the processing of the second parity sector and the fifth parity sector based on a number of unrecovered codewords covered by each of the second parity sector and the fifth parity sector.

10. The data storage device as recited in claim 9, wherein the control circuitry is further configured to process the second parity sector before processing the fifth parity sector when the number of unrecovered codewords covered by the second parity sector is less than the number of unrecovered codewords covered by the fifth parity sector.

11. A data storage device comprising:
non-volatile storage comprising a storage element having a plurality of data segments including a first data segment and a second data segment; and
control circuitry configured to:
generate a first plurality of codewords each comprising a plurality of symbols;
generate a first parity sector over the first plurality of codewords;
write the first plurality of codewords and the first parity sector to the first data segment;
generate a second plurality of codewords each comprising a plurality of symbols;
generate a second parity sector over the second plurality of codewords;
write the second plurality of codewords and the second parity sector to the second data segment;
generate a third parity sector over a first subset of the first plurality of codewords and a first subset of the second plurality of codewords;
generate a fourth parity sector over a second subset of the first plurality of codewords and a second subset of the second plurality of codewords;
read a first codeword from the first data segment and first process the first codeword using a low density parity check (LDPC) type decoder; and
when the first processing of the first codeword fails:
process the first, second, third, and fourth parity sectors as codewords using the LDPC type decoder, wherein a corresponding parity sector generated over the parity sector codewords contains all zeros; and
process the first codeword and the first parity sector using the LDPC type decoder.

12. The data storage device as recited in claim 11, wherein:
the first subset of the first plurality of codewords consists of a first interleave of the first plurality of codewords; and
the second subset of the first plurality of codewords consists of a second interleave of the first plurality of codewords.

13. A method of operating a data storage device, the method comprising:
generating a first plurality of codewords each comprising a plurality of symbols;
generating a first parity sector over the first plurality of codewords;
writing the first plurality of codewords and the first parity sector to a first data segment of a data track a disk;
generating a second plurality of codewords each comprising a plurality of symbols;
generating a second parity sector over the second plurality of codewords;
writing the second plurality of codewords and the second parity sector to a second data segment of the data track;
generating a third parity sector over a first subset of the first plurality of codewords and a first subset of the second plurality of codewords;
generating a fourth parity sector over a second subset of the first plurality of codewords and a second subset of the second plurality of codewords;
reading a first codeword from the first data segment and first processing the first codeword using a low density parity check (LDPC) type decoder; and
when the first processing of the first codeword fails:
selecting one of the third or fourth parity sectors based on a number of unrecovered codewords covered by each of the third and fourth parity sectors; and
processing at least one of the codewords read from the data track and the selected parity sector using the LDPC type decoder.

14. The method as recited in claim 13, wherein:
the first subset of the first plurality of codewords consists of a first interleave of the first plurality of codewords; and
the second subset of the first plurality of codewords consists of a second interleave of the first plurality of codewords.

15. The method as recited in claim 13, wherein when the first processing of the first codeword fails, the method further comprises processing the second parity sector using the LDPC type decoder to recover a second codeword read from the second data segment.

16. The method as recited in claim 13, wherein when the first processing of the first codeword fails, the method further comprises:
- processing the fourth parity sector using the LDPC type decoder to recover a second codeword read from the first data segment; and
- when the second codeword is recovered, processing the first codeword and the first parity sector using the LDPC type decoder.

* * * * *